United States Patent [19]
Kogan

[11] Patent Number: 5,885,428
[45] Date of Patent: Mar. 23, 1999

[54] METHOD AND APPARATUS FOR BOTH MECHANICALLY AND ELECTROSTATICALLY CLAMPING A WAFER TO A PEDESTAL WITHIN A SEMICONDUCTOR WAFER PROCESSING SYSTEM

[75] Inventor: Igor Kogan, San Francisco, Calif.

[73] Assignee: Applied Materials, Inc., Santa Clara, Calif.

[21] Appl. No.: 758,829

[22] Filed: Dec. 4, 1996

[51] Int. Cl.⁶ .................................................. C23C 14/50
[52] U.S. Cl. .............................. 204/298.15; 204/298.09; 156/345; 118/723 E; 118/728; 118/729
[58] Field of Search ................................ 156/345, 643.1; 216/67, 71; 204/298.15, 298.07, 298.09, 192.1; 427/248.1; 118/721, 723 E, 724, 725, 728, 729

[56] References Cited

U.S. PATENT DOCUMENTS

| | | | |
|---|---|---|---|
| 4,565,601 | 1/1986 | Kakehi et al. | 204/298.09 |
| 4,968,374 | 11/1990 | Tsukada et al. | 204/298.31 |
| 5,350,479 | 9/1994 | Collins et al. | 156/345 |
| 5,591,269 | 1/1997 | Arami et al. | 118/728 |

*Primary Examiner*—Nam Nguyen
*Assistant Examiner*—Rodney G. McDonald
*Attorney, Agent, or Firm*—Thomason & Moser

[57] ABSTRACT

Method and apparatus for retaining a workpiece in a process chamber of a semiconductor wafer processing system. The apparatus has a mechanical clamp for clamping the periphery of the workpiece to a pedestal and an electrostatic clamp for clamping the center of the workpiece to the pedestal.

10 Claims, 4 Drawing Sheets

METHOD AND APPARATUS FOR BOTH MECHANICALLY AND ELECTROSTATICALLY CLAMPING A WAFER TO A PEDESTAL WITHIN A SEMICONDUCTOR WAFER PROCESSING SYSTEM

BACKGROUND OF THE INVENTION

1. Field of the Invention

The invention relates generally to chucks for holding a wafer and, more specifically, to an improved chuck for clamping large diameter (300 mm or more) wafers containing a mechanical clamp for clamping the periphery of the wafer and an electrostatic clamp for clamping the center of the wafer.

2. Description of the Background Art

Chucks, either mechanical or electrostatic, are used for holding a workpiece in various applications ranging from holding a sheet of paper in a computer graphics plotter to holding a wafer within a semiconductor wafer process chamber. Mechanical chucks typically secure a workpiece, i.e., semiconductor wafer, to the chuck by applying a physical holding force to a clamping ring or calipers located at the periphery of the wafer. The wafer is held in place until the physical force is reversed and the clamping ring or calipers retract. Electrostatic chucks perform this task by creating an electrostatic attractive force between the wafer and the chuck. A voltage is applied to one or more electrodes in the chuck so as to induce opposite polarity charges in the wafer and electrodes, respectively. The opposite charges pull the wafer against the chuck, thereby retaining the wafer.

A diameter of 200 mm is an accepted industry standard for semiconductor wafer size. In semiconductor wafer processing equipment, either type of chuck (mechanical or electrostatic) is used for clamping 200 mm wafers to a pedestal during processing. For example, in a physical vapor deposition (PVD) chamber, a 200 mm wafer is mechanically clamped to the pedestal to ensure that the wafer is stationary during processing. To enhance some PVD processes, the pedestal is heated to heat the wafer to an appropriate temperature to facilitate efficient processing. Increased demand for 200 mm wafers led to improvements in chuck construction and features for processing this size substrate. This resulted in higher yields, better temperature control and an overall better quality product.

The latest generation of semiconductor wafers have diameters of 300 mm to accommodate fabrication of even more integrated circuit components on a single wafer. Unfortunately, the larger size wafers carry with them their own set of production problems. For example, early test designs of chucks for such wafers allow bowing at the wafer center when a backside gas is introduced into the region under the wafer and above the pedestal. Pumping a backside gas into this region is a popular and highly efficient method for transferring heat from the wafer being processed to the pedestal or vice versa. Smaller wafers bow slightly at their center due to the pressure exerted by the gas. Usually, for 200 mm wafers, the bowing is not significant and temperature uniformity across the wafer does not vary greatly. However, for 300 mm wafers, wafer bowing can be substantial. Such bowing interferes with wafer processing and can lead to wafer damage.

For example, FIG. 1 depicts a conventional PVD chamber 100 for processing 300 mm semiconductor wafers. The wafer 102 rests on support surface 105 of a pedestal 104. The pedestal 104 is supported by a pedestal base 106 which contains the necessary wiring to conduct power from a remote power source (not shown) to the heating elements (not shown) within the pedestal 104. The wafer 102 is mechanically clamped to the pedestal 104 by a peripheral clamping ring 108. Lift pins 110 mounted on a platform 112 connected to a vertical shaft 114 serve to lift the wafer 102 off the pedestal surface 105 after processing. Once a wafer 102 is clamped, a heat transfer gas is pumped into the region 113 between the wafer 102 and support surface 105 until an optimal pressure for heat transfer is reached. The bowing of the wafer resulting from the backside gas pressure is seen in the circled portion of FIG. 1. This condition causes a loss of contact area between the wafer and the pedestal as well as non-uniform distribution of heat transfer gas. This in turn contributes to a non-uniform temperature profile across the wafer and may also lead to stress fractures in the substrate material. Maintaining a uniform temperature across the wafer is necessary and important to ensure high performance and yield of the end product. Consequently, processing a 300 mm wafer under these conditions may lead to process irregularities and wafer damage.

Therefore, there is a need in the art for an improved chuck that reduces wafer bowing at the center and improves temperature uniformity across the wafer.

SUMMARY OF THE INVENTION

The disadvantages heretofore associated with the prior art are overcome by an improved chuck for retaining a wafer in a semiconductor wafer processing system. The inventive chuck combines both mechanical and electrostatic chucking techniques to secure a large diameter wafer to a pedestal.

Specifically, the inventive apparatus consists of a pedestal for supporting a wafer, a mechanical clamping portion for mechanically clamping the wafer at its periphery and an electrostatic clamping portion for electrostatically clamping the wafer at its center. The mechanical clamping portion can be a clamping ring located above the periphery of the pedestal or some other apparatus for mechanically clamping the peripheral edge of the wafer. The electrostatic clamping portion contains one or more electrodes encased in a dielectric material and positioned proximate the center of the pedestal surface. Preferably, the pedestal surface contains a centrally located recess within which the electrostatic clamping portion is located. The "mini" electrostatic chuck is secured to the recess by an annular clamping ring bolted to the pedestal. A region of the bottom of the electrode(s) is exposed to facilitate electrical connection to the electrode(s).

The apparatus also contains grooves for heat transfer gas distribution. These grooves are located about the periphery of the chuck and extend radially inward, stopping at the electrostatic clamping portion. The grooves are supplied heat transfer gas via conduits extending through the pedestal.

In operation, a wafer is positioned upon the pedestal surface using a conventional robotic wafer transport assembly. The wafer is first mechanically clamped at its periphery to the pedestal and then electrostatically clamped to the pedestal at its center. Once clamped, the invention applies a heat transfer gas between the wafer and the pedestal.

This invention fulfills the long felt need for a method and apparatus that can effectively clamp a large (300 mm diameter) wafer to a chuck and provide heat transfer characteristics similar to those found in semiconductor wafer processing systems that process smaller diameter wafers.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
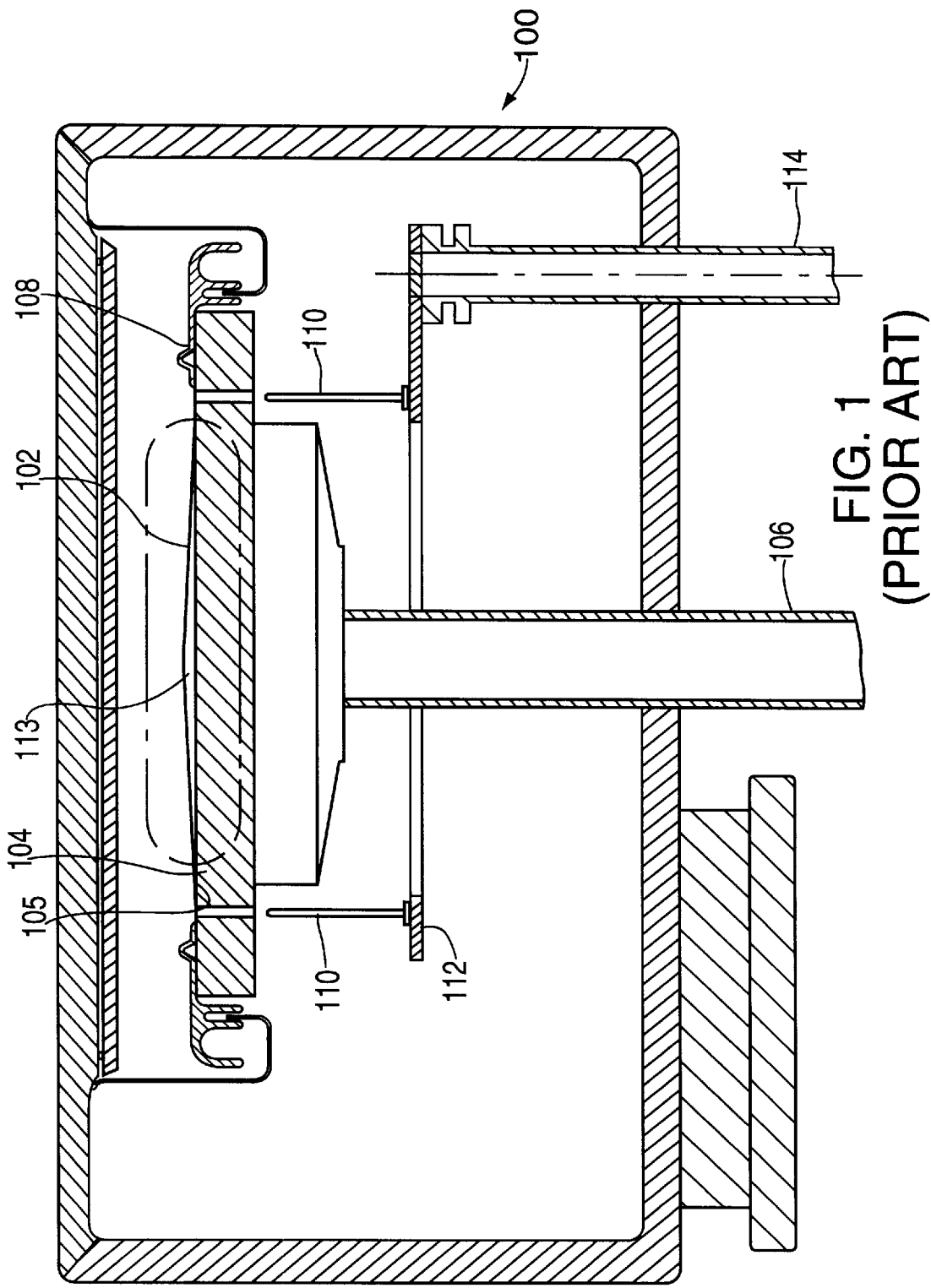
FIG. 1 depicts a cross-sectional view of a conventional mechanical clamping chuck inside a PVD chamber.
Figure 2:
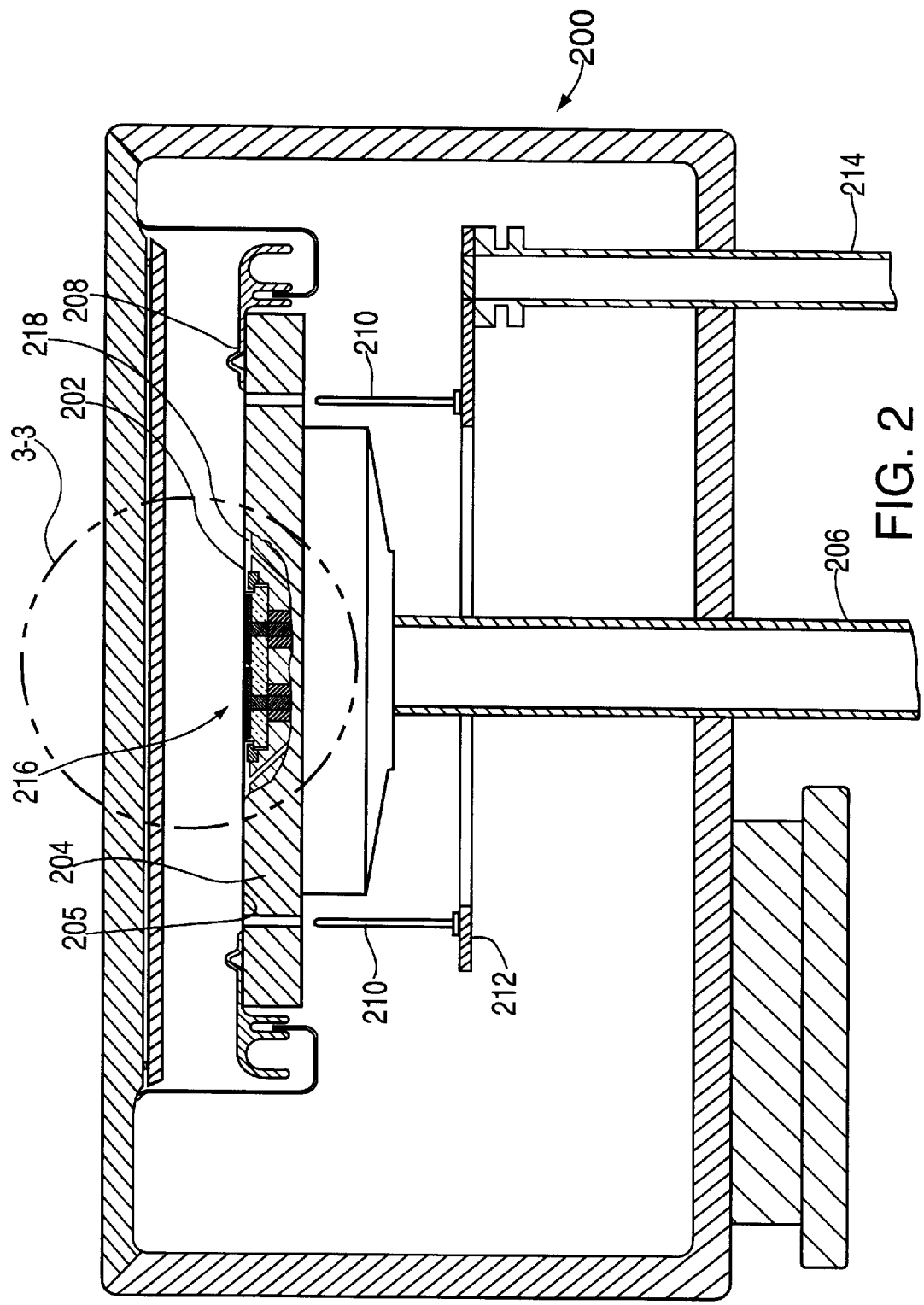
FIG. 2 depicts a cross-sectional view of the inventive chuck inside an illustrative PVD chamber with mechanical and electrostatic clamping provisions.

FIG. 2 depicts a cross-sectional view of the inventive chuck adapted to both mechanically and electrostatically clamp a wafer 202 to a pedestal 204 within a process chamber 200 of a semiconductor wafer processing system, e.g., a PVD system. For a detailed understanding of the PVD reaction chamber and its operation in processing a wafer, the reader should refer to the drawings and the detailed description contained in U.S. Pat. No. 5,228,501, issued Jul. 20, 1993 incorporated herein by reference. That disclosure discloses a wafer support assembly used in a physical vapor deposition chamber manufactured by Applied Materials, Inc. of Santa Clara, Calif.

All of the components necessary to process the wafer 202 operate identically to those discussed in the prior art chamber including pedestal base 206, wafer clamping ring 208 and lift pins 210 mounted on a platform 212 connected to a vertical shaft 214. Preferably, the pedestal 204 is constructed from a heat conductive metal, i.e., stainless steel or copper.

In accordance with the present invention, the pedestal 204 is provided with a bipolar electrostatic chuck assembly 216 located at the center of the pedestal 204. The electrostatic chuck assembly has a wafer support surface that is positioned substantially flush with a pedestal surface 205 (a wafer support surface). The electrostatic chuck assembly 216 creates an electric field at the center of the pedestal 204 which draws the center of a 300 mm wafer toward the pedestal surface 205 to eliminate wafer bowing.

Figure 3:
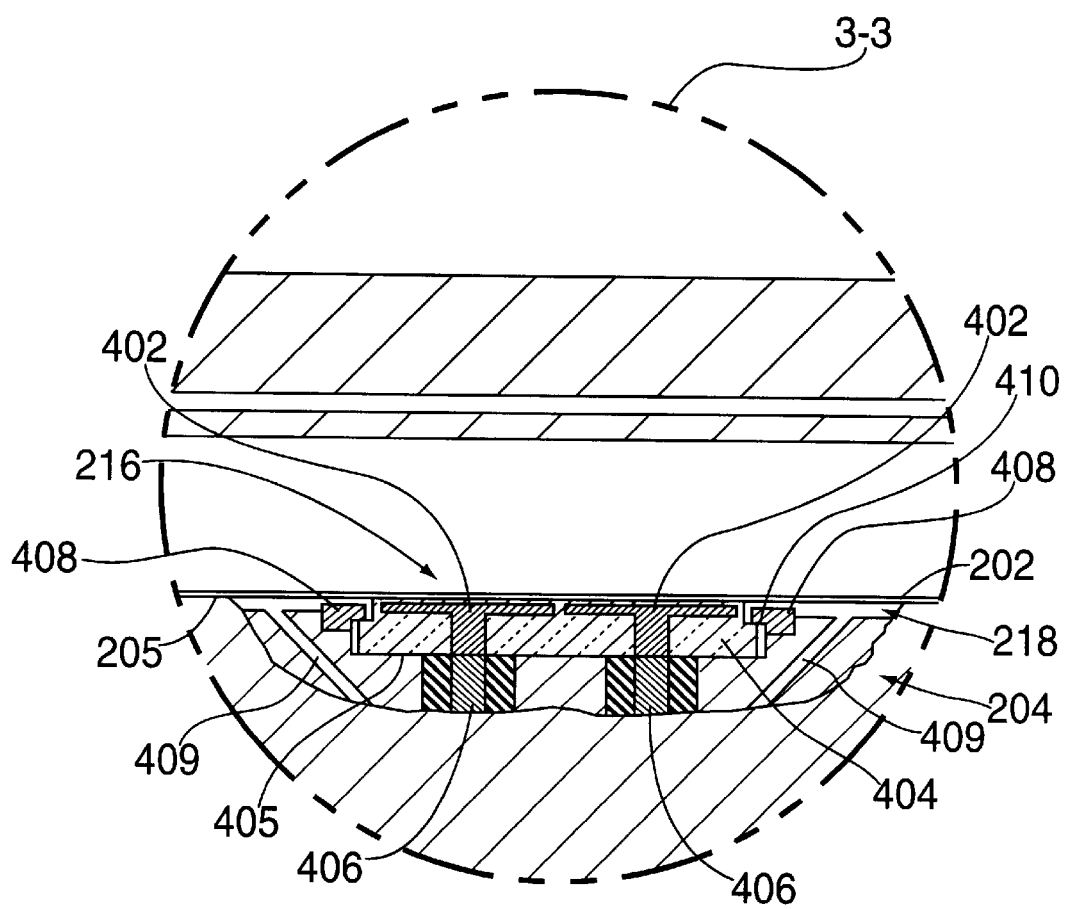
FIG. 3 is a detailed view of a central portion 3—3 of the inventive chuck depicted in FIG. 2.

Specifically, in FIG. 3, the electrostatic chuck assembly 216 contains two electrodes 402 (generally a pair of half-moon shaped, coplanar conductors) encased in a circular slab of dielectric material 404. The dielectric material is preferably ceramic. The electrostatic chuck assembly 216 rests inside a recessed portion 405 of the pedestal surface 205. The pedestal 204 is provided with two electric leads 406 that contact the bottom of each of the bipolar electrodes 402. The electric leads conduct a voltage from a remote voltage source (not shown) through the pedestal base 206 to the bipolar electrodes 402. To facilitate clamping, a positive voltage is applied to one electrode and a negative voltage is applied to the other electrode.

To retain the electrostatic chuck assembly 216 in the recessed portion 405, an annular clamp 408 is provided to engage a lip 410 of the electrostatic chuck assembly 216. With the electrostatic chuck assembly 216 secured by the clamp 408 and voltage applied to the bipolar electrodes 402 from the remote voltage source, a localized electric field is established at the center of the pedestal 204. Specifically, an electric field is produced between the electrodes and couples to the underside of the wafer. As charges accumulate on the underside of the wafer, the electric field draws the wafer 202 toward the pedestal surface 205 for increased contact with the surface. Such wafer-to-pedestal contact results in increased heat conduction between the wafer and pedestal. To enhance this heat conduction, a heat transfer gas is pumped into the interstitial spaces between the wafer 202 and the pedestal surface 205. The gas is pumped beneath the wafer via inlet ports 409. Gas distribution grooves 218 are formed in the pedestal surface and connected to the inlet ports. Although various groove patterns could be used, illustratively, the grooves extend radially outwards from the clamp 408 at four evenly spaced locations. A gas distribution groove is also provided at the periphery of the pedestal 204 to interconnect each radially extending groove.

Although the preferred embodiment of the invention contains a bipolar electrostatic chuck assembly within a depression in the surface of the pedestal, the electrostatic chuck assembly could be of any form of electrostatic chuck. For example, the electrostatic chuck assembly could be unipolar, e.g., having a single electrode. Furthermore, the electrostatic chuck assembly does not have to reside within a recessed area of the pedestal. For example, the electrostatic chuck could be a flex circuit type chuck having one or more electrodes sandwiched between a pair of dielectric layers (e.g., polyimide layers). The flexible assembly is then adhered to the surface of the pedestal near the center thereof using an adhesive.

Figure 4:
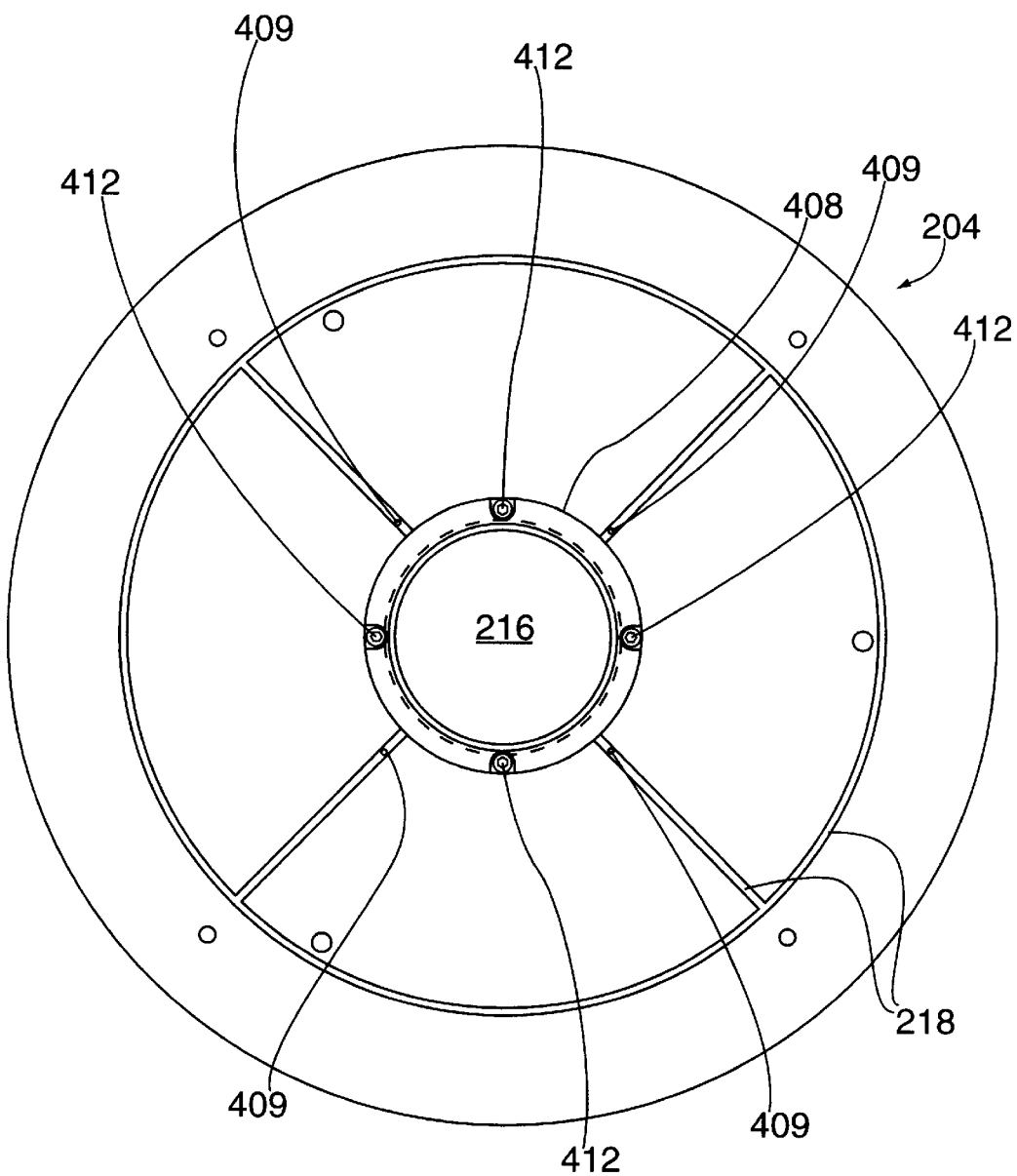
FIG. 4 is a top plan view of the pedestal of the inventive chuck.

FIG. 4 shows a top view of the preferred embodiment of the pedestal 204. Specifically, the electrostatic chuck assembly 216 is circular, with a corresponding annular clamp 408 circumscribing its periphery. The clamp is secured at four points by bolts 412 communicating with threaded bores (not shown) in the pedestal surface 205. As previously discussed the gas distribution grooves 218 do not totally extend to the center of the pedestal. As such, a lower volume of gas is introduced to the center which will also reduce the wafer's tendency to bow. The device is extremely effective, in that it reduces bowing at precisely the point where additional clamping is required the most, namely, the center of the wafer. Additionally, the simplicity in its design make it cost-effective to manufacture and incorporate into existing pedestal designs.

Although various embodiments which incorporate the teachings of the present invention have been shown and described in detail herein, those skilled in the art can readily devise many other varied embodiments that still incorporate these teachings.

What is claimed is:

1. Apparatus for retaining a workpiece in a process chamber of a semiconductor wafer processing system comprising:

a pedestal having a wafer support surface;

a mechanical clamp for exclusively clamping a periphery of the workpiece to the wafer support surface of the pedestal;

an electrostatic clamp, positioned proximate a center of the pedestal, for exclusively clamping the workpiece to the pedestal at the center of the workpiece; and a clamp for securing the electrostatic clamp to the wafer support surface.

2. The apparatus of claim 1 wherein the mechanical clamp comprises a wafer clamping ring.

3. The apparatus of claim 1 wherein the electrostatic clamp further comprises a set of bipolar electrodes encased in a dielectric material.

4. The apparatus of claim 3 wherein the dielectric material has a peripheral lip.

5. The apparatus of claim 4 wherein the pedestal has a recessed center in which the electrostatic clamp is located.

6. The apparatus of claim 5 wherein the electrostatic clamp is secured to the recessed center of the pedestal by the clamp.

7. The apparatus of claim 6 wherein the clamp is an annular clamping ring attached to the pedestal at the peripheral lip of the dielectric material.

8. The apparatus of claim 1 further comprising heat transfer gas distribution means for distributing heat transfer gas between the pedestal and the workpiece.

9. The apparatus of claim 8 wherein the heat transfer gas distribution means comprises at least one groove located about the periphery of the pedestal and at least one groove extending radially inward therefrom toward the electrostatic clamp.

10. Apparatus for retaining a workpiece in a process chamber of a semiconductor wafer processing system comprising:

a pedestal having a center, a periphery, and a heat transfer gas distribution groove at the periphery and a plurality of heat transfer gas distribution grooves spaced evenly about the periphery and extending radially toward the center;

a mechanical clamping ring, located at the periphery of the pedestal, for clamping a periphery of the workpiece to the pedestal; and a bipolar electrostatic chuck, secured in a recess in the center of the pedestal by an annular clamping ring circumscribing the bipolar electrostatic chuck, for electrostatically clamping a center of the workpiece.

* * * * *